United States Patent
Xhakoni et al.

(10) Patent No.: US 10,340,936 B2
(45) Date of Patent: Jul. 2, 2019

(54) ANALOG-TO-DIGITAL CONVERSION AND METHOD OF ANALOG-TO-DIGITAL CONVERSION

(71) Applicant: ams Sensors Belgium BVBA, Antwerp (BE)

(72) Inventors: Adi Xhakoni, Leuven (BE); Tim Blanchaert, Geel (BE)

(73) Assignee: ams Sensors Belgium BVBA, Antwerp (BE)

( * ) Notice: Subject to any disclaimer, the term of this patent is extended or adjusted under 35 U.S.C. 154(b) by 0 days.

(21) Appl. No.: 15/773,149

(22) PCT Filed: Oct. 27, 2016

(86) PCT No.: PCT/EP2016/075964
§ 371 (c)(1),
(2) Date: May 2, 2018

(87) PCT Pub. No.: WO2017/076748
PCT Pub. Date: May 11, 2017

(65) Prior Publication Data
US 2018/0323795 A1    Nov. 8, 2018

(30) Foreign Application Priority Data
Nov. 6, 2015    (EP) .................................... 15193533

(51) Int. Cl.
*H03M 1/12* (2006.01)
*H03M 1/18* (2006.01)
(Continued)

(52) U.S. Cl.
CPC ............. *H03M 1/182* (2013.01); *H03M 1/56* (2013.01); *H04N 5/3575* (2013.01);
(Continued)

(58) Field of Classification Search
CPC ...... H03M 1/182; H03M 1/1235; H03M 1/56; H04N 5/365; H04N 5/3575; H04N 5/378; H04N 5/357; H04N 5/3742
(Continued)

(56) References Cited

U.S. PATENT DOCUMENTS 5,321,404 A    6/1994    Mallinson et al.
7,825,975 B2   11/2010   Fowler
(Continued)

FOREIGN PATENT DOCUMENTS

| EP | 2645575 A2 | 10/2013 |
| EP | 2750369 A2 | 7/2014 |
| EP | 2757776 A2 | 7/2014 |

OTHER PUBLICATIONS

Snoeij, M. et al.: "Multiple-Ramp Column-Parallel ADC Architectures for CMOS Image Sensors" 2007, IEEE Journal of Solid-State Circuits 2968-2977.
(Continued)

*Primary Examiner* — Khai M Nguyen
(74) *Attorney, Agent, or Firm* — Fish & Richardson P.C.

(57) ABSTRACT

An analog-to-digital converter (110) for an imaging device comprises an analog signal input (123) for receiving an analog signal from a pixel array of the imaging device and N ramp signal inputs (121, 122) for receiving N ramp signals, where N is an integer ≥2. The N ramp signals have different slopes. The ADC has a clock input (143) for receiving at least one clock signal. A comparison stage (120) is connected to the ramp signal inputs and to the analog signal input. The comparison stage (120) is configured to compare the ramp signals with the analog signal to provide comparison outputs during the conversion period. A control stage (130) is configured to control a counter stage (140) based on the comparison outputs and a selection input
(Continued)

indicative of when at least one handover point has been reached during the conversion period.

12 Claims, 12 Drawing Sheets

(51) Int. Cl.
*H03M 1/56* (2006.01)
*H04N 5/357* (2011.01)
*H04N 5/365* (2011.01)
*H04N 5/378* (2011.01)

(52) U.S. Cl.
CPC ............ *H04N 5/365* (2013.01); *H04N 5/378* (2013.01); *H03M 1/1235* (2013.01)

(58) Field of Classification Search
USPC ...... 341/155, 164, 167–170; 348/222.1, 302, 348/303, 308; 250/208.1
See application file for complete search history.

(56) References Cited

U.S. PATENT DOCUMENTS

| | | | |
|---|---|---|---|
| 8,040,269 B2 | 10/2011 | Bogaerts | |
| 8,350,941 B2* | 1/2013 | Kukita | H04N 5/23241 |
| | | | 250/208.1 |
| 8,922,668 B2* | 12/2014 | Ota | H04N 5/357 |
| | | | 348/222.1 |
| 9,019,141 B2 | 4/2015 | Hashimoto et al. | |
| 9,686,492 B2* | 6/2017 | Uchida | H04N 5/37452 |
| 2013/0206961 A1 | 8/2013 | Ikeda et al. | |
| 2014/0209784 A1* | 7/2014 | Morita | H04N 5/378 |
| | | | 250/208.1 |

OTHER PUBLICATIONS

Xhakoni, A. et al.: "PTC-Based Sigma-Delta ADCs for High-Speed, Low-Noise Imagers" 2014, Sensors Journal, IEEE 2932-2933.

* cited by examiner

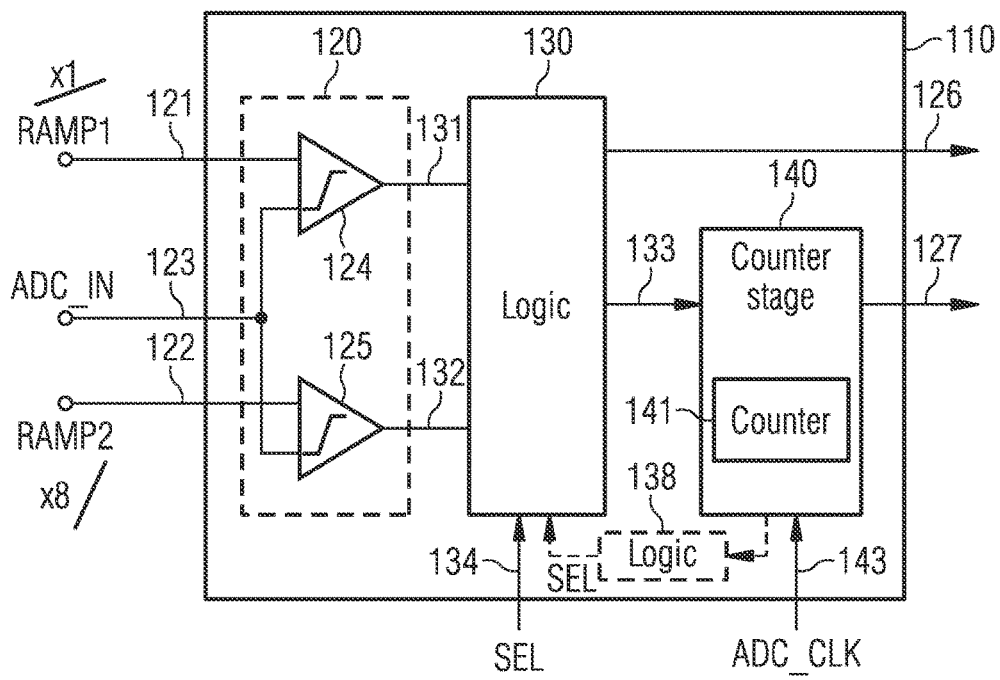
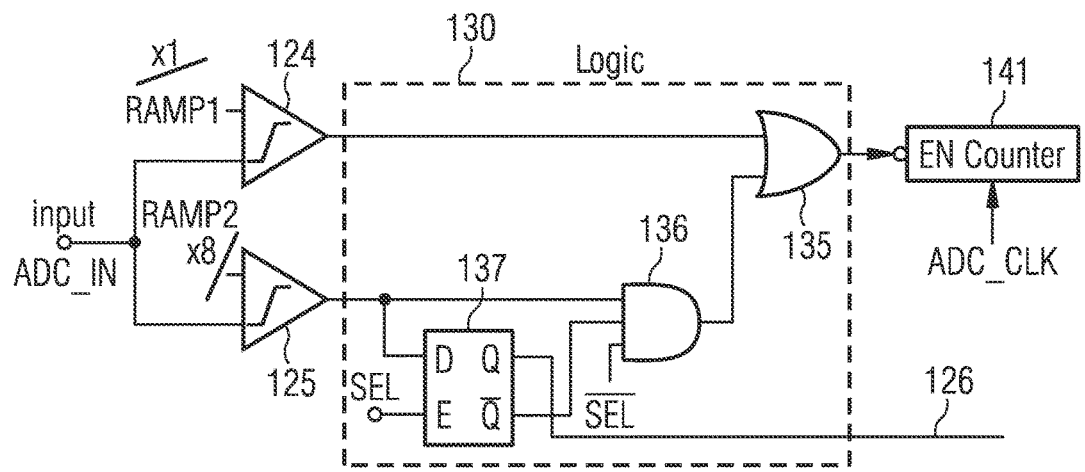

Sig 1: (count signal−count reset) · ramp ratio = (10−1) · 8 = 72
Sig 2: (count signal−count reset) = (19−5) = 14

ANALOG-TO-DIGITAL CONVERSION AND METHOD OF ANALOG-TO-DIGITAL CONVERSION

CROSS-REFERENCE TO RELATED APPLICATIONS

The present application is the national stage entry of International Patent Application No. PCT/EP2016/075964, filed on Oct. 27, 2016, which claims the benefit of priority under 35 U.S.C. § 119 of European Patent Office Application 15193533.5 filed on Nov. 6, 2015, and relates to International Patent Application No. PCT/EP2016/075962, filed on Oct. 27, 2016, all of which are hereby incorporated by reference in their entirety for all purposes.

TECHNICAL FIELD

This invention relates to an analog-to-digital converter and to a method of performing analog-to-digital conversion which can be used, for example, to convert analog signal levels output from a pixel array of an imaging device.

BACKGROUND OF THE INVENTION

Image sensors comprise an array of unit elements, called pixels. The array of pixels is exposed to radiation during an exposure period and, subsequently, the signal value of each pixel is read from the array.

Pixel signals are analog signals. An analog-to-digital converter (ADC) is provided to convert the analog pixel signal into a digital signal. The ADCs are a major building block in image sensors and are often the bottleneck in the readout block of the imagers in terms of frame rate, dynamic range and power consumption. Various arrangements have been proposed where analog-to-digital conversion is performed, in parallel, for analog signal values read from columns of the array. This helps to increase the speed at which the pixel array can be read. FIG. 1 shows an example of an image sensor architecture with a pixel array 10 and ADCs 20 provided for each column of the pixel array 10.

One known type of ADC in image sensors is a ramp ADC. This is shown in FIGS. 1 and 2. A ramp generator 21 generates a ramp signal, Vramp, which is distributed to the ADCs 20. Each ramp ADC 20 has a comparator 23 which compares an analog pixel signal ADC_IN[0], ... ADC_IN[N] received from the pixel array 10 with the ramp signal, Vramp. Each analog-to-digital converter 20 also comprises a counter 24 which is enabled for a period of time based on the comparator output. This time period can be translated to a digital number by the digital counter 24 which is active during this period. Given its mostly digital nature, the ramp ADC scales well with the technology.

FIG. 3 shows the effect of ramp steepness and clock speed on the performance of the ramp converter. The counter value DN corresponds to the digital representation of the input analog signal. One way of reducing the quantisation error, and hence the Least Significant Bit (LSB) value, is to increase the clock speed, as shown in FIG. 3(B). Another way of reducing the quantisation error, and hence the Least Significant Bit (LSB) value, is to reduce the steepness of the ramp, as shown in FIG. 3(C). A significant drawback of reducing the steepness of the ramp is that the input range of the ADC is reduced accordingly. Therefore, the ADC is unable to convert the same range of analog signal values as the ADC of FIG. 3(A).

As each clock cycle corresponds to a quantisation step (LSB), the number of clock cycles needed for N bit resolution is equal to $2^N$. For example, a 12-bit resolution requires 4096 clock cycles. Even when a high clock speed of 1 GHz is used, it takes over 4 µs time to complete the analog-to-digital conversion. It follows that this converter topology becomes slow and power-inefficient as the number of bits of resolution increases.

Therefore, new solutions are needed to increase the conversion speed of such converter at higher bit resolutions.

To reduce the conversion time and/or reduce the power consumption of the ADCs, a photon-transfer-curve (PTC) method has been proposed for image sensor ADCs. An example is described in the paper "PTC-Based Sigma-Delta ADCs for High-Speed, Low-Noise Imagers", Xhakoni, A., Ha Le-Thai, T. Geurts, G. Chapinal, and G. Gielen, 2014, Sensors Journal, IEEE 2932-2933. The principle is shown in FIG. 4. In FIG. 4, line A illustrates a signal, line B a photon shot noise and line C a quantization noise.

A PTC-based ADC uses a small quantisation step at low light and a large quantisation step at higher light levels. At high light levels the noise of the readout chain is dominated by the photon shot noise of the photodiode, which is signal dependent. Therefore, the larger quantisation step of the PTC ADC at high light levels has a minimal impact on the SNR. In a ramp ADC, the PTC-based quantisation can be achieved by using two different ramps of different steepness. For example, at high light a ramp with steepness X could be used. At low light a ramp with steepness X/8 would reduce the quantisation step by 8× as well. In case 12-bit low light equivalent resolution is needed, one could use a ramp ADC with the equivalent number of clock cycles of a 9 bit ADC and have a slow ramp with steepness 8× lower than that of the fast ramp, achieving the quantisation step of a 12 bit ADC (LSB12=LSB9/8).

FIG. 5 shows the impact of the PTC-based quantisation in the SNR of the pixel readout chain when a pixel with 10ke-full well is used. The difference in SNR between the PTC-based 12 bit ADC and the conventional 12 bit ADC is a SNR dip of about 0.2 dB at mid-light level.

A few methods have been developed to achieve the PTC-based quantisation step in ramp ADCs. Examples are described in the paper "Multiple-Ramp Column-Parallel ADC Architectures for CMOS Image Sensors", Martijn F. Snoeij, Albert J. P. Theuwissen, Kofi A. A. Makinwa, Johan H. Huij sing, 2007, IEEE JOURNAL OF SOLID-STATE CIRCUITS 2968-2977 and in US 2013/0206961 A1. Snoeij describes a Multiple-Ramp Single-Slope (MRSS) method and a Multiple-Ramp Multiple-Slope (MRMS) method. Both methods require a coarse comparison phase before a fine comparison phase.

The method described in US 2013/0206961 A1 uses a comparator to detect whether the analog signal to be converted is below, or above, a reference level. Depending on the outcome of the comparison, a fast ramp or a slow ramp is used in the ADC to convert the analog signal. This requires a ramp preselection comparator with strict offset requirements. In addition, the conversion time is increased as the ramp preselection is performed before the actual conversion.

The present patent application seeks to provide an alternative analog-to-digital converter.

SUMMARY OF THE INVENTION

In an embodiment, an analog-to-digital converter for an imaging device comprises:

an analog signal input for receiving an analog signal from a pixel array of the imaging device;

N ramp signal inputs for receiving N ramp signals, where N is an integer ≥2, the N ramp signals having different slopes;

a clock input for receiving at least one clock signal;

a comparison stage connected to the ramp signal inputs and to the analog signal input, the comparison stage configured to compare the ramp signals with the analog signal during a conversion period to provide comparison outputs;

a counter stage; and a control stage which is configured to control the counter stage based on the comparison outputs and a selection input indicative of when at least one handover point has been reached during the conversion period, wherein the handover point is indicative of a point at which a comparison output of a different one of the ramp signals with the analog signal can be used to control the counter stage.

The comparison stage may comprise a minimum of two comparators.

The comparison stage of the analog-to-digital converter, abbreviated ADC, may simultaneously compare each of the N ramp signals with the analog signal to provide N comparison outputs. Alternatively, the comparison stage of the ADC may simultaneously compare a number S of the N ramp signals (where S<N) with the analog signal to simultaneously provide S comparison outputs. The comparison stage may be configured to selectively compare different ones of the ramp signals with the analog signal during the conversion period.

The control stage can be configured to change, during the conversion period, control of the counter stage from a comparison output of a first ramp signal to a comparison output of a second, different, ramp signal. The second ramp signal may have a higher slope than the first ramp signal.

The control stage is configured to use the comparison output of the shallowest ramp signal to control the counter stage after a start of the conversion period and before a first handover point. The shallowest ramp signal has the slowest slope of all ramp signals.

The control stage can be configured to: determine, during the conversion period, if a comparison output of the $N^{th}$ ramp signal has changed state before the handover point associated with a comparison output of an $n^{th}$ ramp signal has been reached, where n is an integer in the range 1 . . . N−1; and to use the comparison output of the $n^{th}$ ramp signal to control the counter stage if the comparison output of the $N^{th}$ ramp signal has changed state before the handover point associated with the comparison output of the $n^{th}$ ramp signal has been reached.

The number n is a natural number and obtains values between 1 and N.

The control stage can be configured to use a comparison output of the $(n+1)^{th}$ ramp signal to control the counter stage if the comparison output of the $N^{th}$ ramp signal has not changed state before the handover point associated with the comparison output of the $n^{th}$ ramp signal has been reached.

The $(n+1)^{th}$ ramp signal has a higher steepness than the $n^{th}$ ramp signal. The $(n+1)^{th}$ ramp signal has a higher slope than the $n^{th}$ ramp signal. The $(n+1)^{th}$ ramp signal is faster than the $n^{th}$ ramp signal. This is valid for each number n between 1≤n≤N−1.

The first ramp signal (n=1) has the shallowest slope. The Nth ramp signal has the highest slope.

An output stage of the ADC can be configured to output a counter value which has been scaled based on a comparison output of which ramp signal controlled the counter stage during the conversion period.

An output stage of the ADC can be configured to output a counter value and an indication of a comparison output of which ramp signal controlled the counter stage during the conversion period.

The conversion period may have a predetermined duration.

The ADC can be configured to convert a first analog signal during a first conversion period and to convert a second analog signal during a second conversion period, wherein one of the analog signals represents a signal level following exposure of a pixel of the pixel array and the other of the analog signals represents a reset level of the pixel of the pixel array.

The pixel array may consist of one pixel or of 1 times K pixels or of L times K pixels.

The ADC can be configured to: select a comparison output of one of the ramp signals to control the counter stage during the first conversion period; and subsequently, use the same comparison output to control the counter stage during the second conversion period.

The ADC can be configured to: select a comparison output of one of the ramp signals to control the counter stage during the first conversion period; and select a comparison output of a different one of the ramp signals to control the counter stage during the second conversion period.

The ADC can be configured to: convert the first analog signal representing the signal level following exposure of the pixel during the first conversion period; and subsequently, convert the second analog signal representing the reset level of the pixel during the second conversion period.

Alternatively, the ADC can be configured to: convert the first analog signal representing the reset level of the pixel during the first conversion period; and subsequently, convert the second analog signal representing the signal level following exposure of the pixel during the second conversion period.

For example, the first conversion period may be before the second conversion period.

An output stage can be configured to output a digital value representative of a difference between the first analog signal and the second analog signal.

The ADC can be configured to determine when the handover point has been reached during the conversion period using an output of the counter stage.

The comparison stage can comprise N comparators, each comparator having a first comparator input connected to one of the N ramp signal inputs, a second input connected to the analog signal input and a comparison output.

For the N>2 case it can be possible to use a minimum of two comparators. One of the comparators can be connected to the fastest ramp signal. The fastest ramp signal is the $N^{th}$ ramp signal. The other comparator can be selectively connected to one of the ramp signals.

Another aspect provides an analog-to-digital conversion apparatus comprising:

a plurality of analog-to-digital converters;

a ramp signal generator configured to generate N ramp signals, where N≥2, the N ramp signals having different slopes; and a clock signal generator configured to generate the at least one clock signal.

Another aspect provides an image sensor comprising a pixel array and analog-to-digital conversion apparatus.

Another aspect provides a method of analog-to-digital conversion for an imaging device comprising:

receiving an analog signal from a pixel array of the imaging device;

receiving N ramp signals, where N≥2, the N ramp signals having different slopes;

receiving at least one clock signal;

comparing the ramp signals with the analog signal during a conversion period to provide comparison outputs; and controlling a counter stage to generate a digital signal by selecting one of the comparison outputs to control the counter stage based on the comparison outputs and a selection input indicative of when at least one handover point has been reached during the conversion period, wherein the handover point is indicative of a point at which a comparison output of a different one of the ramp signals with the analog signal can be used to control the counter stage.

Each of the comparison outputs can be associated with a range of the analog signal and the handover point can be indicative of a point during the conversion period when an analog signal input range associated with one comparator can change to an analog signal input range associated with another one of the comparators.

A comparator stage compares the ramp signals with the analog signal during the conversion period to provide comparison outputs.

The comparison stage may comprise at least two comparators. Advantageously, by the use of at least two comparators, only one step for storage of counter content and only one register is required. The speed of conversion may be kept high. The power consumption of the ADC is reduced, since counters are the major power consuming blocks of a ramp ADC.

Each of the comparators receives the same analog signal. The at least two comparators may be realized identical.

One of the at least two comparators may receive the fastest ramp signal, namely the Nth ramp signal. Said comparator may be called fastest ramp comparator.

In an embodiment, the ADC comprises two comparators and uses two ramp signals. The fastest ramp signal is provided to the fastest ramp comparator and a shallowest ramp signal is provided to a so called shallowest ramp comparator. Since N=2, this situation can also be described in the following way: A fast ramp signal is provided to a fast ramp comparator and a slow ramp signal is provided to a slow ramp comparator. The fast ramp signal is the second ramp signal. The slow ramp signal is the first ramp signal. Thus, each comparator is permanently connected to its own ramp signal. Advantageously, switching to and, hence disturbances on the ramp signals are avoided. The number of comparators and the number of ramp signals is exactly two.

In an embodiment, the ADC comprises N comparators and uses N ramp signals. Each comparator is permanently connected to its own ramp signal. Advantageously, a switching from one ramp signal to another is avoided. The number of comparators and the number of ramp signals is exactly N, with N≥2.

In an embodiment, the ADC comprises M comparators and uses N ramp signals, where N>M≥2.

In an embodiment, the ADC comprises exactly two comparators and uses exactly N ramp signals with N>2 (thus, M=2). Thus, the number of the ramp signals is higher than the number of the comparators. One of the comparators is connected to the fastest ramp signal. The other comparator is selectively connected to one of the ramp signals. Optionally, the other comparator is selectively connected to one of the ramp signals with the exception of the fastest ramp signal.

The counter stage can comprise a plurality of counters which are divided into a first counter sub-set and a second counter sub-set, and the control stage can be configured to enable the first counter sub-set or the second counter sub-set.

The first counter sub-set can be configured to count in an upwards direction and the second counter sub-set can be configured to count in a downwards direction.

The plurality of counters can be configured to use clock signals which are offset in phase.

The pixel array and/or the analog-to-digital conversion apparatus can be manufactured using a technology such as Complementary Metal Oxide Semiconductor (CMOS).

The pixel array can be a one dimensional array (linear sensor) or a two dimensional array (area array) of pixels.

In an embodiment, an ADC comprises an analog signal input for receiving an analog signal; N ramp signal inputs for receiving N ramp signals, where N is an integer ≥2, the N ramp signals having different slopes; a clock input for receiving at least one clock signal; a comparison stage connected to the ramp signal inputs and to the analog signal input, the comparison stage configured to compare the ramp signals with the analog signal during a conversion period to provide comparison outputs; a counter stage; and a control stage which is configured to control the counter stage based on the comparison outputs and a selection input indicative of when at least one handover point has been reached during the conversion period.

The handover point is indicative of a point at which a comparison output of the present ramp signal with the analog signal or a comparison output of a different one of the ramp signal s with the analog signal is selectively used to control the counter stage after said handover point.

The selection depends on the fulfillment of a condition. The selection depends on whether a comparison output of the $N^{th}$ ramp signal has changed state before the handover point associated with a comparison output of an $n^{th}$ ramp signal has been reached, where n is an integer in the range 1 . . . N−1.

In an embodiment, at the start of a conversion period, the first ramp signal (n=1) is compared with the analog signal to control the counter stage. If the comparison output of the $N^{th}$ ramp signal changes state before the handover point associated with the comparison output of the first ramp signal is reached, than the first ramp signal (n=1) is continuously compared with the analog signal to control the counter stage. If the comparison output of the $N^{th}$ ramp signal does not change state before the handover point associated with the comparison output of the first ramp signal is reached, than the second ramp signal (n=2) is compared with the analog signal to control the counter stage; this change from the first to the second ramp signal occurs at said handover point.

Only in case of a change of state of the comparison output of the $N^{th}$ ramp signal, the change from one ramp signal to another ramp signal occurs, namely from the $n^{th}$ to the $(n+1)^{th}$ ramp signal.

In an embodiment, the $n^{th}$ ramp signal or the $(n+1)^{th}$ ramp signal is compared with the analog signal to control the counter stage depending on whether the comparison output of the $N^{th}$ ramp signal has changed state before the handover point associated with the comparison output of an $n^{th}$ ramp signal has been reached. Thus, the $n^{th}$ ramp signal or the $(n+1)^{th}$ ramp signal is compared with the analog signal depending on the amplitude of the analog signal generated by light received by a pixel.

Advantageous features may be combined as appropriate, as would be apparent to a skilled person, and may be combined with any of the aspects of the invention.

BRIEF DESCRIPTION OF THE DRAWINGS

Embodiments of aspects of the invention will be described, by way of example, with reference to the following drawings, in which:

FIG. 7 shows an ADC unit for use in the image sensor of FIG. 6;
FIG. 8 shows an example logic unit for use in the ADC unit of FIG. 7.

Components, circuit parts and devices that are functionally identical or have the identical effect bear identical reference numbers. Insofar as components, circuit parts or devices correspond to one another in function, a description of them will not be repeated in each of the figures.

DETAILED DESCRIPTION

Embodiments of aspects of the present invention are described below by way of example only. The description sets forth the functions of the example and the sequence of steps for constructing and operating the example. However, the same or equivalent functions and sequences may be accomplished by different examples.

Throughout this specification, it should be noted that the term "row" and "column" can be interchanged. Also, the term "row" does not imply a particular orientation of the array.

Figure 1:
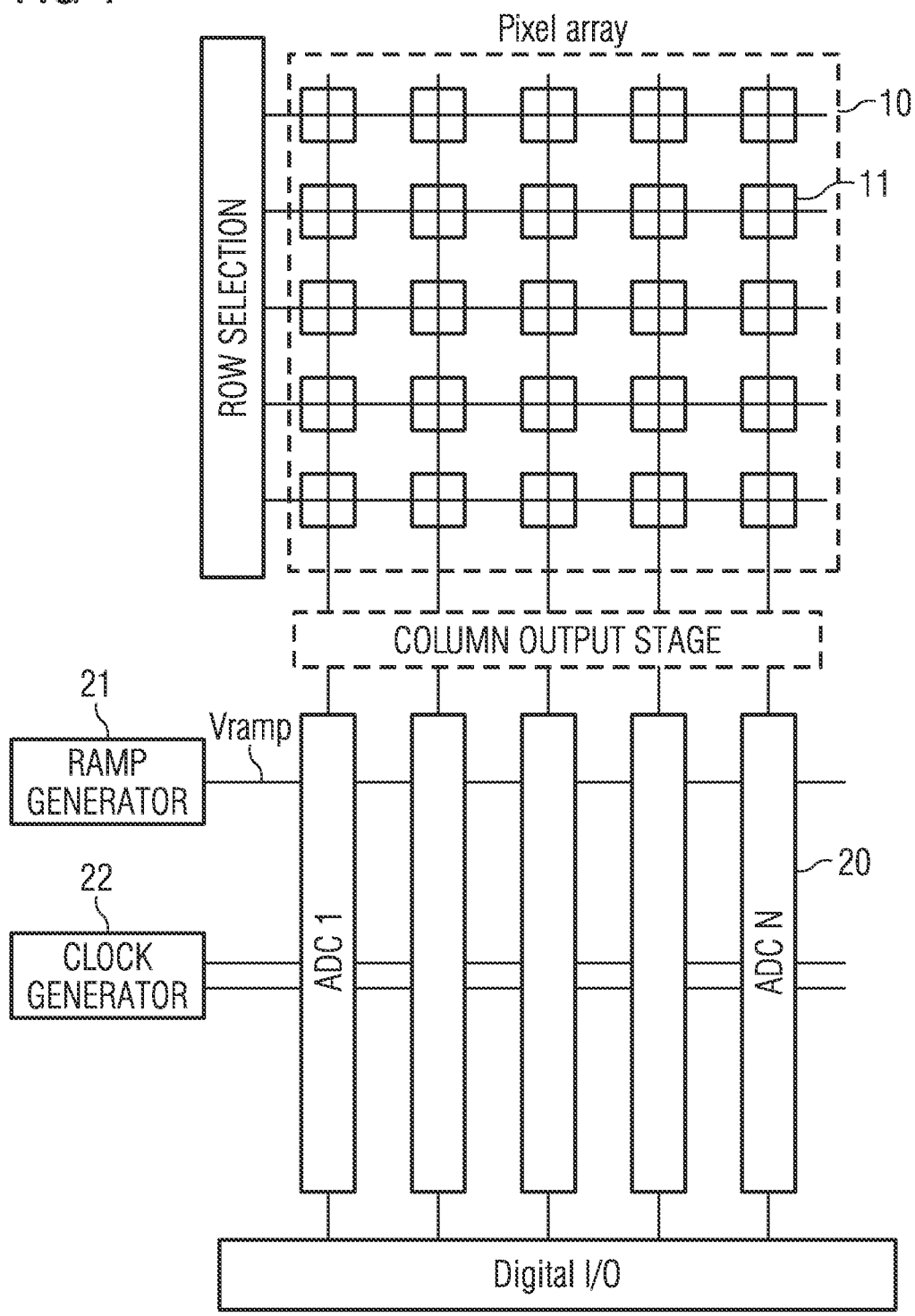
FIG. 1 shows an image sensor with a ramp ADC.
Figure 2:
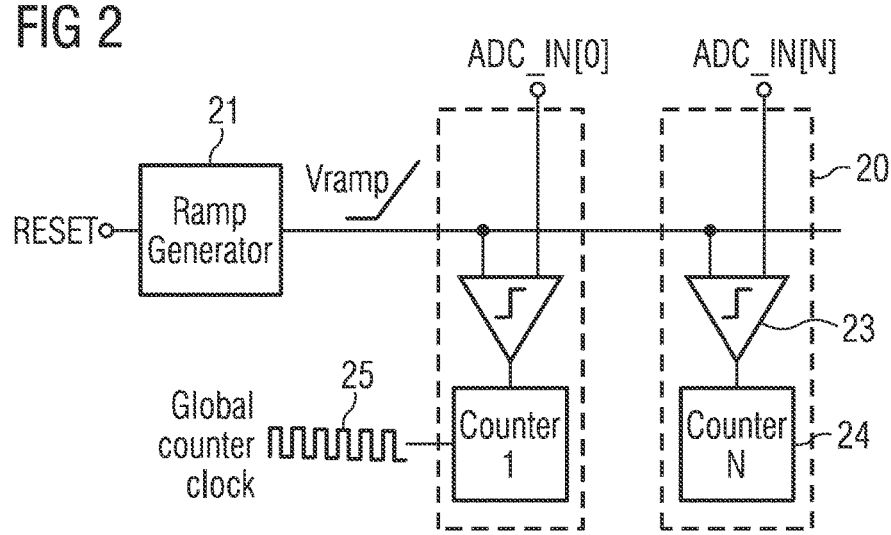
FIG. 2 shows column units of a ramp ADC.
Figure 3:
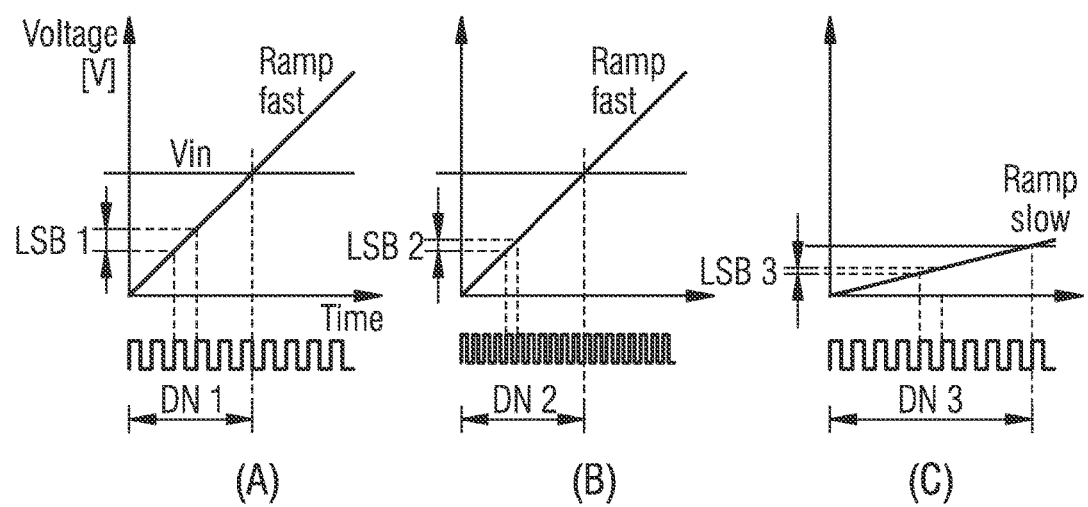
FIG. 3 shows some possible ways of reducing quantisation error.
Figure 4:
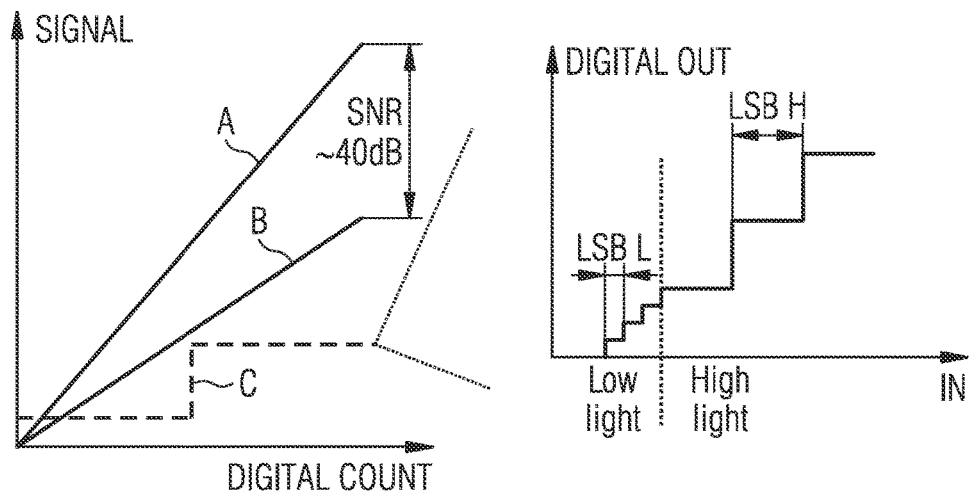
FIG. 4 shows a photon-transfer-curve (PTC) method for image sensor ADCs.
Figure 5:
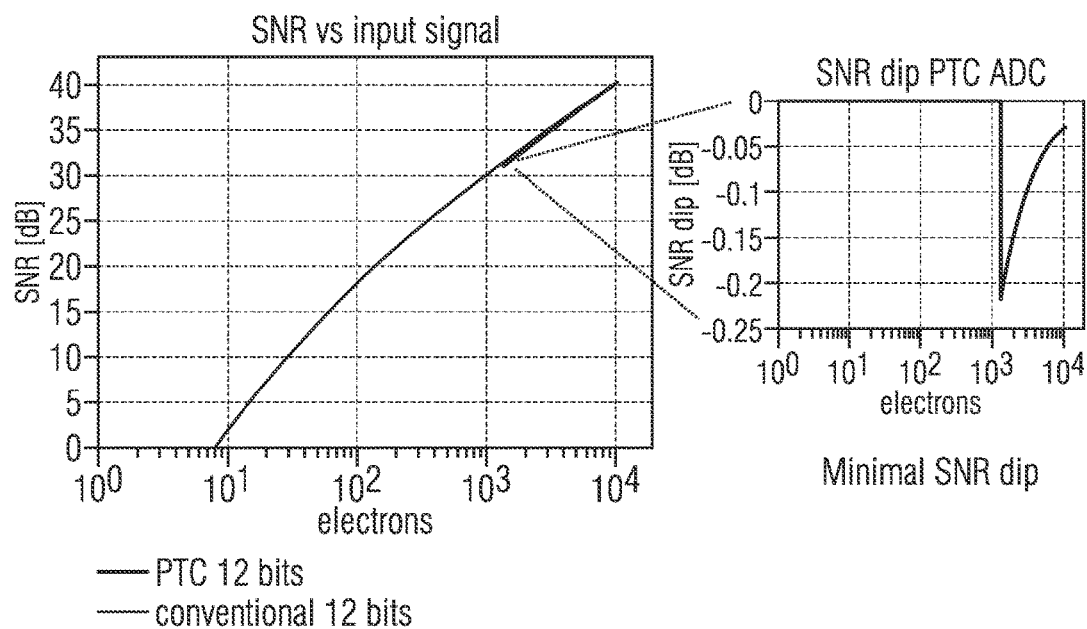
FIG. 5 shows performance of the PTC method of FIG. 4.
Figure 6:
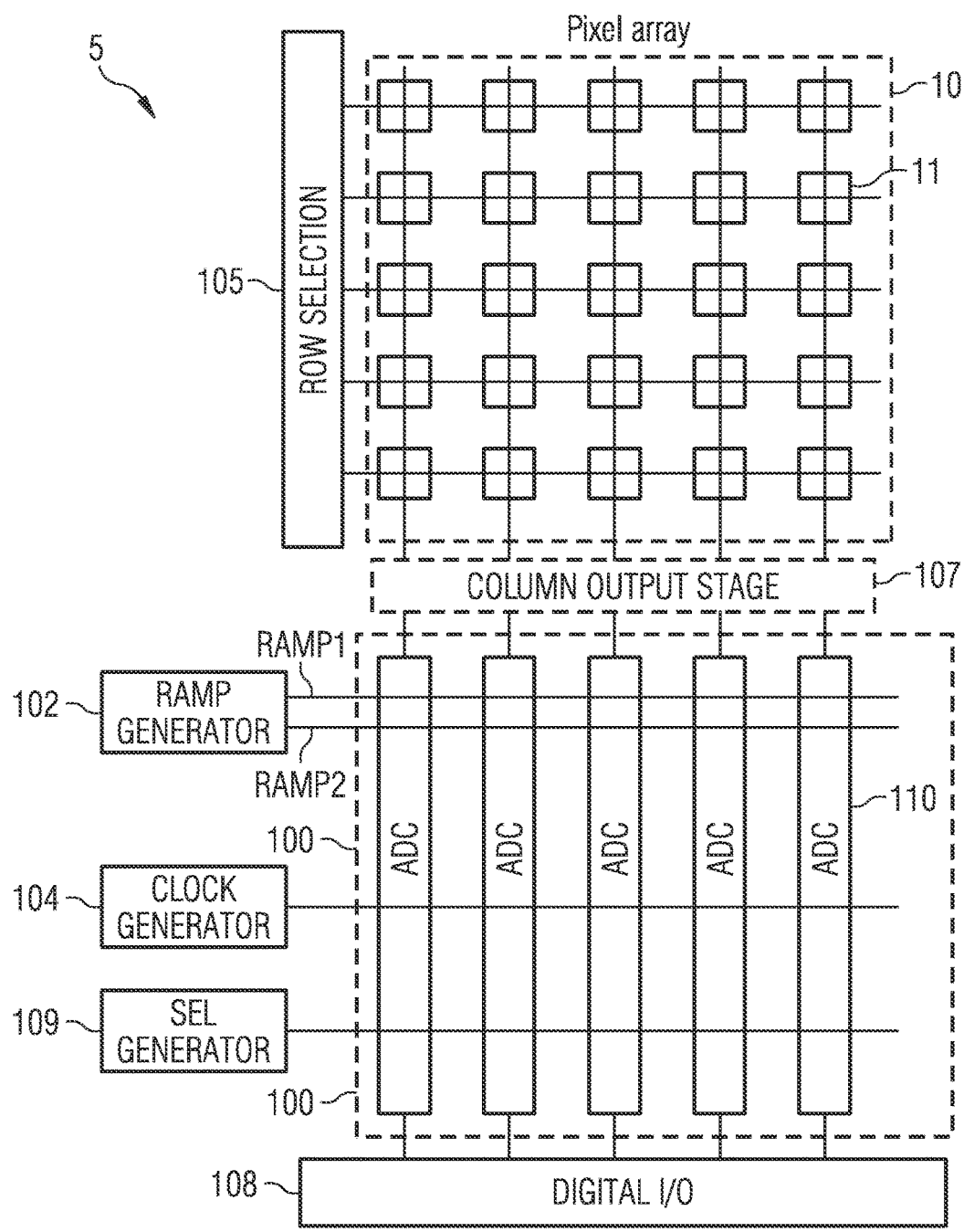
FIG. 6 shows an image sensor with multiple ramps.

FIG. 6 shows an image sensor 5 with a ramp ADC. The image sensor 5 comprises a pixel array 10 comprising a plurality of pixels 11. The pixels 11 can be arranged in a rectangular array of rows and columns of pixels, as shown in FIG. 6. Alternatively, the pixels can be arranged in any other suitable pattern.

Analog-to-digital conversion apparatus 100 is provided for analog-to-digital conversion of outputs of the pixel array 10. An ADC 110 is provided for each column of the pixel array 10. The set of ADCs 110 can be operated in parallel with one another, thereby increasing the speed at which data can be read from the pixel array 10 and converted to digital values. For ease of explanation, embodiments will be described in terms of a column of pixels sharing an ADC. As described above, an ADC 110 can be provided for any other group of pixels, such as a row of pixels or a diagonal group of pixels. Another possible configuration is the use of two or more ADCs per pixel column pitch. This allows to read out two rows of the pixel array in parallel. Another possibility is the use of one ADC per two or more columns.

While it is possible to read just one analog value from a pixel 11, it is more usual to read two analog signals from the pixel 11 using a technique called Correlated Double Sampling (CDS). The two analog signals are a reset voltage, Vres, and a signal voltage, Vsig. The reset voltage Vres is a voltage of a pixel 11 following the reset of the pixel 11 itself. This can also be described as a noise level of the pixel 11. The signal voltage Vsig is a voltage of a pixel 11 following exposure to light during an exposure period. This disclosure refers to signal voltages read from a pixel array. It is also possible to read signal currents from a pixel array. The term "analog signal" is intended to include voltages and currents.

Each of the ADCs 110 receives the two analog signals from a column of the pixel array 10. A useful quantity is the difference (Vsig-Vres) between the signal voltage Vsig and the reset voltage Vres. Each of the ADCs 110 can convert a difference between the two analog signals, Vres and Vsig, to a digital value. A row selection circuit 105 controls which row of pixels 11 of the pixel array 10 is read out. For example, rows can be selected one at a time, on a rotating basis. When a row is selected, a reset level and a signal level can be read from each pixel 11 of the selected row, and output on a column output bus. The values read from the pixel 11 can be stored in a column output stage 107, such as a sample-and-hold stage.

A ramp generator 102 generates a plurality, N, of ramp signals which are distributed to the ADCs 110. N is an integer ≥2. For simplicity, FIG. 6 shows two ramp signals: RAMP1, RAMP2. The ramp signals have different slopes. The term "slope" means a rate of change of a quantity, such as voltage, over time. In the case of two ramp signals, the ramp signal with the steepest slope can be called a fast ramp signal and the ramp signal with the shallowest slope can be called a slow ramp signal. The fast ramp signal is a second ramp signal RAMP2. The slow ramp signal is a first ramp signal RAMP1.

A clock generator 104 generates at least one clock signal which is distributed to the ADCs 110. It is possible to use multiple clock signals which are offset in phase from one another. Each ADC 110 uses the ramp signals and the clock signal(s) to perform analog-to-digital conversion.

It is possible, in any of the examples, to provide a clock generator 104 and/or a ramp generator 102 more locally to each ADC 110 in the manner described in U.S. Pat. No. 8,040,269. For example, there can be a clock generator 104 and/or a ramp generator 102 per analog-to-digital converter 110, or a clock generator 104 and/or a ramp generator 102 per sub-set of the overall set 100 of ADCs.

Moreover, the image sensor 5 comprises a digital input/output circuit 108 coupled to the ADCs 110. The image sensor 5 comprises a SEL generator unit 109.

Figure 9:
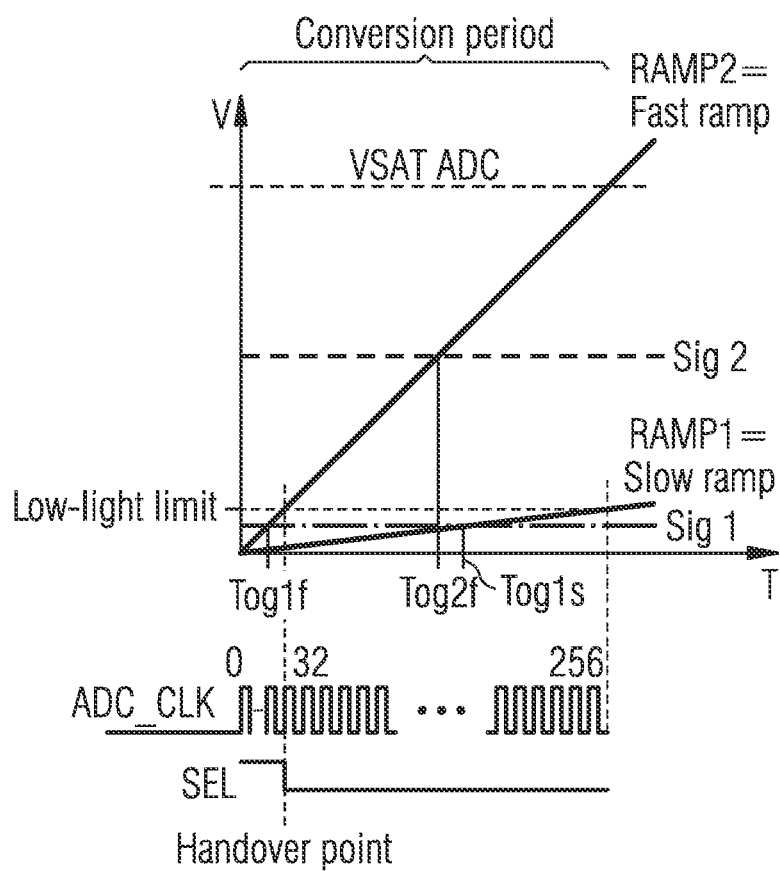
FIG. 9 shows operation of the ADC of FIGS. 7 and 8.

FIGS. 7 to 9 show an example of an analog-to-digital converter 110 which can be used to perform analog-to-digital conversion of signals on a column output of a pixel array 10. The ADC 110 comprises ramp signal inputs 121, 122 for receiving the ramp signals RAMP1, RAMP2. The ADC 110 comprises an analog signal input 123 for receiving at least one analog signal from the pixel array. The ADC 110 may sequentially receive an analog signal Vsig and an analog signal Vres on input 123. The ADC 110 comprises a comparison stage 120. In the example shown in FIG. 7 the comparison stage 120 comprises two comparators 124, 125. The ADC comprises a control stage 130, which can be implemented as a logic unit 130. The ADC comprises a counter stage 140. The analog signal input 123 is connected to a respective first input of each of the comparators 124, 125. A first of the ramp signals (RAMP1) is connected to a second input of comparator 124. A second of the ramp signals (RAMP2) is connected to a second input of comparator 125. The comparators 124, 125 will be called ramp comparators in the following description. The ADC 110 can be extended to a larger number of ramp signals and ramp comparators, as will be described later. An output of each of the ramp comparators 124, 125 is connected to the logic unit 130. An output 133 of the logic unit 130 is connected to the counter stage 140. A clock signal ADC_CLK is applied to a clock input 143 of the counter stage 140. The counter stage 140 comprises at least one counter 141. For simplicity, a single counter example will be described.

The N ramp signals start at the same time. A start of the N ramp signals defines a start of a conversion period. An end of the N ramp signals defines an end of the conversion period.

In operation, the counter stage 140 is selectively enabled during a conversion period. The counter stage 140 is enabled by the signal received from the logic unit 130. The logic unit 130 determines which ramp comparator output should control the counter stage 140. A counter value (i.e. a digital number) accumulated by the counter 141 during the period that the counter 141 is enabled is representative of the analog signal ADC_IN applied at the analog signal input 123. An output 127 outputs a digital counter value. An output 126 indicates which ramp comparator (124 or 125) was used to control the counter stage 140.

To simplify explanation, the second ramp RAMP2 signal (i.e. the fast ramp signal) has a slope which is eight times (8×) higher than the slope of the first ramp signal RAMP1 signal (i.e. the slow ramp signal). The fast ramp signal RAMP2 provides a quantisation step with a magnitude 8× larger than the slow ramp signal RAMP1. The maximum input voltage of the ADC is referred to as VSAT (FIG. 9). This is the maximum analog signal which can be converted using the fast ramp signal RAMP2. The voltage range corresponding to the slow ramp signal is VSAT/8. This is the maximum analog signal which can be converted using the slow ramp signal RAMP1. This will be called the low-light limit. The comparator 124 receives the slow ramp signal RAMP1 and may be named slow ramp comparator. The comparator 125 receives the fast ramp signal RAMP2 and may be named fast ramp comparator.

Referring again to FIG. 7, the logic unit 130 receives a signal SEL at input 134. SEL is a digital signal. A change in state of the SEL signal represents a point at which the fast ramp signal RAMP2 crosses the low-light limit. This will be called a handover point. The handover point is indicative of a point at which a different comparison output (e.g. a different one of the comparators) can be used to control the counter stage 140.

The handover point is predetermined. A duration between the start of the fast ramp signal RAMP2 and the handover point is predetermined. The duration between the start of the fast ramp signal RAMP2 and the handover point consists of a predetermined number of clock cycles. Each of the ramp signals RAMP1, RAMP2 starts at the same point of time, namely the start of a conversion period.

The SEL signal performs a switching from one logic level to another logic level at the handover point. The switching may occur from "0" to "1" or from "1" to "0". For example, the SEL signal has a logic level "1" from t=0 until the handover point at t=32 clock cycles. The SEL signal can change state when a threshold number of clock cycles is reached after the start of the conversion period. In the example of FIG. 8, the SEL signal changes state (from logical "1" to "0") after 32 clock cycles (256/8) of the conversion period. SEL can be supplied by a SEL generator unit 109 external to the ADC 110 which distributes SEL to the plurality of ADCs 110 in a similar manner to the ramp signals and clock signal. SEL is received at an input 134. An alternative way of providing the SEL signal is shown in FIG. 7 in dashed form. SEL can be internally generated by the ADC 110. An output of the counter stage 140 is connected to a logic unit 138. Logic unit 138 compares the counter value with a threshold counter value (e.g. 32). Logic unit 138 outputs the SEL signal to logic unit 130. SEL toggles when the counter value reaches the threshold value of the handover point.

The function of the logic unit 130 is to decide, during a conversion period, which comparator output (131 or 132) controls the counter stage 140. The function of the logic unit 130 is:

for an analog signal ADC_IN in the range 0<analog signal ADC_IN<low-light limit, the comparator 124 connected to the slow ramp signal RAMP1, controls the counter 141;

for an analog signal ADC_IN in the range low-light limit<analog signal ADC_IN<VSAT, the comparator 125 connected to the fast ramp signal RAMP2, controls the counter 141.

The handover point is a point in time at which a decision can be made to handover control of the counter stage 140 from one of the comparison outputs to a different comparison output. The decision of whether to handover control is based on the output of at least one of the comparators 124, 125.

FIG. 9 shows two examples of pixel signals to be converted: a dark pixel signal (Sig 1) and a bright pixel signal (Sig 2). When Sig 1 is applied to the ADC 110, the slow ramp comparator 124 controls the counter stage 140. The fast ramp comparator 125 toggles at time Tog1$f$, when the fast ramp signal RAMP2 crosses Sig 1. Toggling means that a comparator changes the logical value of an output signal of the comparator. As this toggling has occurred before the fast ramp signal RAMP2 reaches the low-light limit (i.e. before the handover point), it is therefore assumed that the slow ramp signal RAMP1 will be able to reach the level of Sig 1 within the duration of the AD conversion. The slow ramp comparator 124 toggles at time Tog1$s$, when the slow ramp signal RAMP1 crosses Sig 1. This stops the counter stage 140. This provides a finer quantisation of the AD conversion than is possible with the fast ramp signal RAMP2.

When the bright-pixel signal Sig 2 is applied to the ADC, the output of the fast ramp comparator 125 does not toggle before the fast ramp signal RAMP2 reaches the low-light limit (i.e. before the handover point). Therefore, it is assumed that the fast ramp signal RAMP2 will be needed to reach the level of Sig 1 within the duration of the AD conversion. The fast ramp comparator 125 toggles at time Tog2$f$, when the fast ramp signal RAMP2 crosses Sig 2. This stops the counter stage 140.

Logic unit 130 makes a decision, at the handover point, whether to handover control of the counter stage 140 from the slow ramp comparator 124 to the fast ramp comparator 125. The fast ramp comparator 125 is conditionally connected to the counter stage 140, and remains connected until the end of the conversion period, if both of the following conditions apply:

(i) the fast ramp signal RAMP2 has reached the low-light limit (i.e. the handover point has been reached);

(ii) the fast ramp comparator 125 has not toggled before it reaches the low-light limit. If the fast ramp comparator 125 has not toggled before it reaches the low-light limit, it means that the analog signal falls within the amplitude range:

low-light limit<analog signal ADC_IN<VSAT and therefore the fast ramp comparator 125 is required.

FIG. 8 shows an example of the logic unit 130 to implement the functionality described above. The logic unit 130 comprises an OR gate 135, an AND gate 136 and a storage element (e.g. a gated latch) 137. The output of the slow ramp comparator 124 is connected to the OR gate 135. The output of the fast ramp comparator 125 is connected to the AND gate 136. The output of the fast ramp comparator 125 is also connected to the memory element 137. AND gate 136 has three inputs: an input from the fast ramp comparator 125, an input from the memory element 137, and an inverted SEL signal.

The logic unit 130 operates as follows. The output of the slow ramp comparator 124 is always connected to the counter stage 140 via OR gate 135. Comparator 124 can disable the counter stage 140 once the slow ramp signal RAMP1 reaches the signal level input. The output of the logic unit 130 is inverted, so when the logic unit 130 outputs a logical "0" the input to the counter is a logical "1" which enables the counter. When the logic unit 130 outputs a logical "1" the input to the counter is a logical "0" which disables the counter. The output of the fast ramp comparator 125 is conditionally connected to the counter stage 140 via the AND gate 136. When SEL switches to a logical "0" (the low-light level is crossed), the output level of the fast comparator 125 is stored in the latch 137. If the stored value in the latch is logical "1", the fast ramp comparator 125 toggled before the fast ramp signal RAMP2 could reach the low-light limit and the output level of that comparator will not affect the counter stage 140. This is due to the 3-input AND gate 136 whose output only becomes logical "1" after SEL is "0", provided that the inverted bit stored in the latch is "1".

For this example, it is assumed that an equivalent low-light ADC resolution of 11 bits is needed. By using the ADC 110, the number of clock cycles of an 8 bit ADC would be sufficient as the additional 3 bits are given by the 8× steepness difference between the ramps. An 8-bit resolution can be achieved by the conventional ramp ADC with only 256 clock cycles.

At the end of the conversion period, the counter stage 140 stores an accumulated counter value which is representative of either:

(i) a number of clock cycles before the slow ramp comparator 124 disabled the counter stage 140; or (ii) a number of clock cycles before the fast ramp comparator 125 disabled the counter stage 140.

Therefore, the counter value may require scaling to an appropriate final value depending which comparator controlled the counter stage 140. In the illustrated example the fast ramp signal RAMP2 has a slope which is eight times (8×) steeper than the slow ramp signal RAMP1. Therefore, a counter value accumulated when the fast ramp comparator 125 controlled the counter 141 requires scaling by the ramp steepness ratio. In this example the ramp steepness ratio is 8. In the digital domain, multiplication by a factor of 8 is readily achieved by left-shifting a binary value by 3 slots in a register. The memory element 137 provides an output (Q)=logical "1" if the fast ramp comparator 125 output was used to control the counter stage 140. This allows the ADC 110 to know whether the counter stage 140 has been stopped by the slow ramp comparator 125 or by the fast ramp comparator 124. An output 126 of the logic unit 130 indicates which ramp comparator (124 or 125) was used to control the counter stage 140. Output 126 can be stored as an additional bit alongside the count value. Alternatively, output 126 can be used to modify the count value.

It will be understood that the logic unit 130 can be implemented in other ways. For example, different kinds of latches and/or gates can be used.

The ADC 110 described above can be used to convert a single analog signal ADC_IN. Correlated Double Sampling (CDS) is a technique which determines the reset level of the pixel 11 and the signal level of the pixel 11. The reset level is subtracted from the signal level to cancel the reset noise and reduce the fixed pattern noise of the pixel 11. Therefore, it is desirable for the ADC 110 to determine a difference between two analog signals Vres and Vsig.

Figure 10:
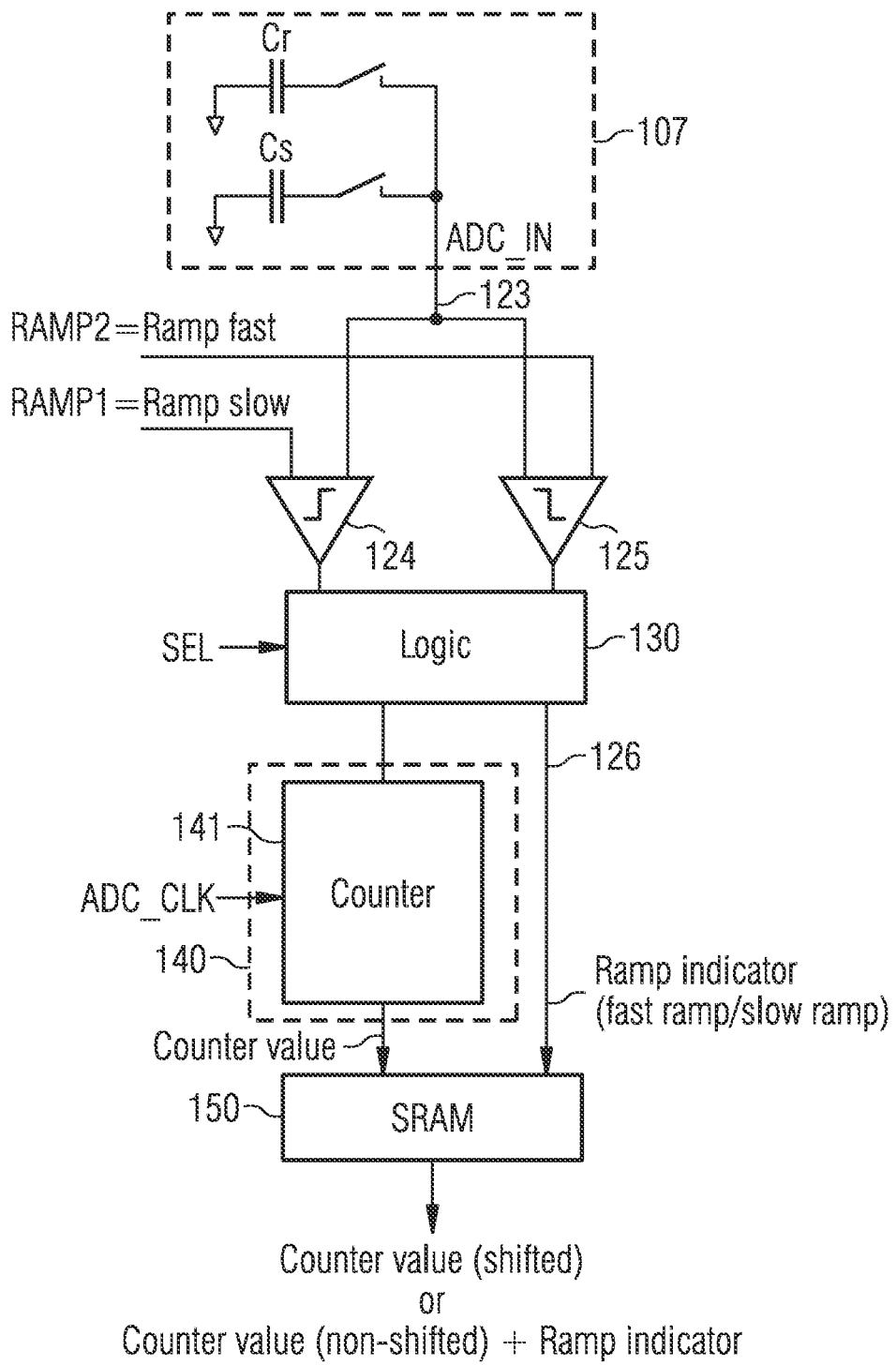
FIG. 10 shows an ADC unit for converting two analog signals.
Figure 11:
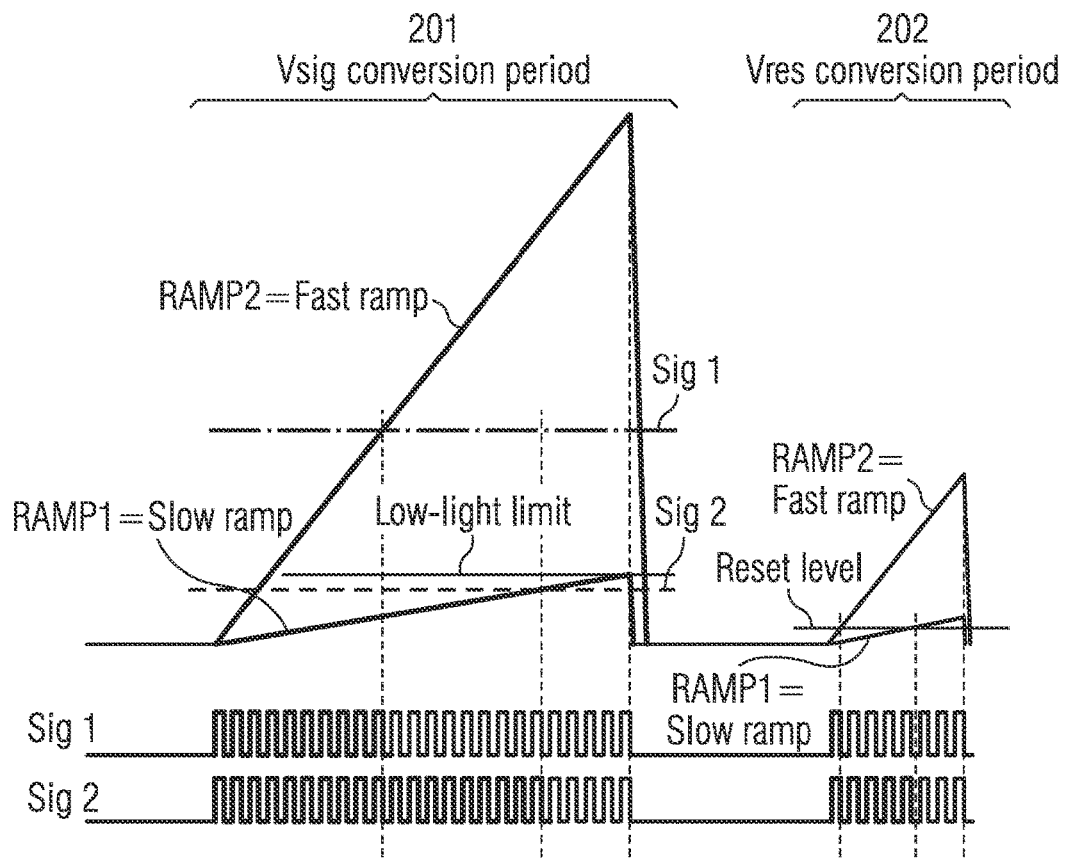
FIG. 11 shows operation of the ADC of FIG. 10 during two conversion periods.

FIGS. 10 and 11 show an example of an ADC 110 for a correlated double sampling signal applied at its input. FIG. 10 shows the ADC 110 and FIG. 11 shows how the ADC 110 performs conversion. The reset level Vres and the signal level Vsig of the pixel 11 can be stored in respective sample & hold capacitors Cr, Cs in a column output stage 107. The reset level Vres and the signal level Vsig of the pixel 11 may be sequentially supplied to the ADC 110 via input 123.

A storage stage 150, such as static random-access memory (SRAM), is connected to the counter stage 140 and to the logic unit 130. Counter stage 140 outputs an accumulated counter value to storage 150. Logic unit 130 outputs an indication of which ramp comparator was used during the conversion to the storage 150. Digital values can be read from storage 150.

Referring to FIG. 11, there is a Vsig conversion period 201 and a Vres conversion period 202. During the Vsig conversion period 201 the Vsig analog signal is converted to a digital counter value. During the Vres conversion period 202 the Vres analog signal is converted to a digital counter value. In this example, the Vsig conversion period 201 occurs before the Vres conversion period 202.

There are several possible methods of operation.

In a first method, the ADC 110 selects which ramp comparator controls the counter 141 during the Vsig conversion period 201 and the same ramp comparator (fast ramp or slow ramp) is used to control the counter 141 during the Vres conversion period 202. This has an advantage that the subtraction between the signal Vsig and the reset level Vres can easily be performed at the counter 141 or the counter stage 140. Another advantage is that it can correct for the ADC offset due to comparator and ramp.

In a second method, the ADC selects which ramp comparator controls the counter 141 during the Vsig conversion period 201 and the slow ramp signal comparator 124 controls the counter 141 during the Vres conversion period 202. This has an advantage of lower quantisation noise during the Vres conversion period 202. The disadvantage is the more complicated subtraction at column level as the signal level Vsig and the reset level Vres might use two ramps having different slopes.

FIG. 11 shows two worked examples for a high light signal Sig 1 and a low light signal Sig 2. In these examples the same ramp comparator is used to control the counter 141 during conversion periods 201 and 202. For the high light signal Sig 1, the fast ramp comparator 125 is selected to control the counter 141 during the Vsig conversion period 201 because Sig 1 is above the low-light limit. A count value=10 is accumulated. The same fast ramp comparator 125 is used to control the counter during the Vres conversion period 202. A count value=1 is accumulated. The difference (count signal−count reset)=10−1=9. The ramp ratio between the fast ramp signal RAMP2 and the slow ramp signal RAMP1 is 8. Therefore, the final value is 9×8=72. For the low light signal Sig 2, the slow ramp comparator 124 is selected to control the counter 141 during the Vsig conversion period 201 because Sig 1 is below the low-light limit. A count value=19 is accumulated. The same slow ramp comparator 124 is used to control the counter during the Vres conversion period 202. A count value=5 is accumulated. The difference (count signal−count reset)=19−5=14. No ramp ratio conversion factor is required, because the slow ramp signal RAMP1 has been used. Therefore, the final value is 14.

In a case where different ramp comparators are used to control the counter 141 during the Vsig conversion period 201 and the Vres conversion period 202, a ramp ratio conversion factor is applied to the counter value obtained using the fast ramp comparator 125 before combining with the counter value obtained using the slow ramp comparator 124.

In another example, the Vres conversion period 202 occurs before the Vsig conversion period 201. A disadvantage of this order is that the ramp selected for conversion of Vres may be different to the ramp needed to convert Vsig. This requires calibration (due to ramp ratio deviation) before a digital subtraction (Vsig−Vres) can be performed at the column.

Returning to FIG. 10, there are several possible ways in which the ADC can be operated.

In a first method, an accumulated counter value is stored in storage 150. A ramp indicator is received at storage 150. The ramp indicator can be a 1 bit value in the case of two ramps signals. If the ramp indicator indicates that the fast ramp comparator 125 was used for the conversion, the counter value is shifted by the ramp ratio conversion factor. In the example described above, the counter value is an 8 bit number. The ramp ratio conversion factor is 8 (=3 bit number). The accumulated counter value is shifted by 3 bits to form an 11 bit number. The resulting 11 bit digital value is read from storage 150. If the ramp indicator indicates that the slow ramp comparator 124 was used for the conversion, the counter value is not shifted, and the 8 bit counter value is read from storage 150.

In a second method, an accumulated counter value is stored in storage 150. A ramp indicator is received, and stored, at storage 150. The non-shifted counter value (8 bits) and the ramp indicator (1 bit) are read from storage 150. This reduces the read out data rate by almost 20%. The counter value is corrected (if required) based on the value of the ramp indicator at a subsequent processing stage.

An advantage of at least one example is that the low-light limit can be easily increased or decreased by modifying the SEL signal. If the ratio of the ramp steepness is not well defined (e.g. not calibrated) a digital code discontinuity could be observed at signal levels close to the low-light limit, generating fixed pattern noise (FPN). It is possible to shift the low-light limit (up or down) in a random fashion on a frame-by-frame basis, row-by-row basis, column-by-column basis, or any other desired basis to randomise the error. For some applications, this randomisation of the FPN can be sufficient, thereby avoiding the need to calibrate the ramp ratio. This reduces the complexity of the system.

The examples described above use a counter stage 140 with a single counter 141. In other examples, it is possible to use a counter stage 140 with a plurality of counters. An ADC with a set of counters is described in EP 2 757 776 A2. The principles described in that document can optionally be used in conjunction with multiple ramp conversion described in this disclosure.

Figure 12:
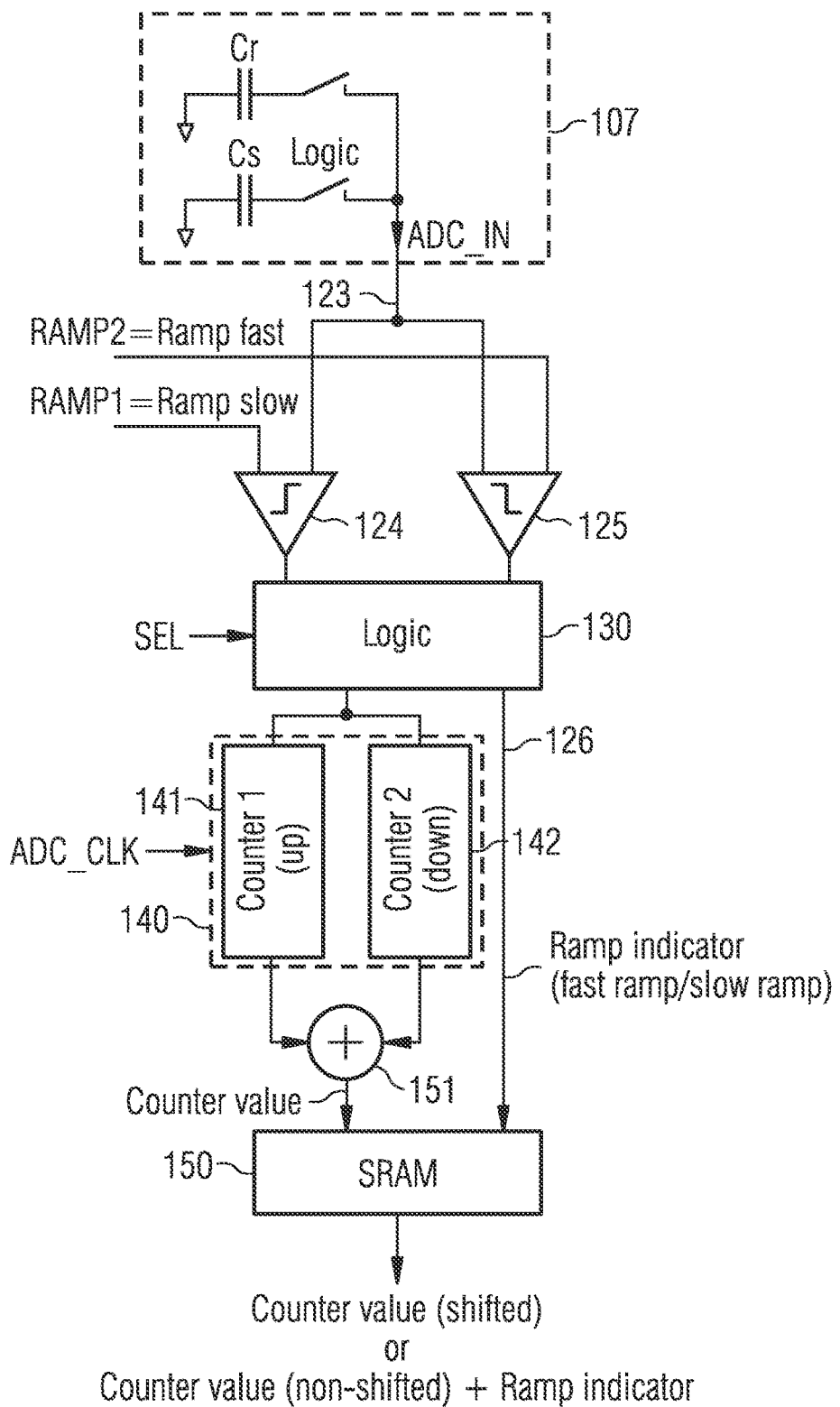
FIG. 12 shows an ADC unit with multiple counters.

FIG. 12 shows an ADC with a counter stage 140 having a plurality of counters 141, 142. This example has two counters: counter 141 and counter 142. Counter 141 is operable to count in an upwards direction and counter 142 is operable to count in a downwards direction. In use, one of the counters (counter 141, counter 142) is enabled at a time. When counter 141 is enabled, counter 142 is disabled. Similarly, when counter 142 is enabled, counter 141 is disabled.

A clock signal, ADC_CLK, is applied to the counter stage 140. The two counters 141, 142 can be configured to operate at opposite clock phases from each other. Counter 141 operates on a rising edge of the clock signal and counter 142 operates on a falling edge of the clock signal. Providing one counter which operates on the rising edge of the clock signal and another counter which operates on the falling edge of the clock signal is functionally equivalent to, and can be implemented by, having two clock signals which are offset in phase by 180 degrees. The falling edge operation of counter 142 can be implemented by inverting the clock signal, ADC_CLK, at the input to counter 142, to create a second, inverted, version of the clock signal, ADC_CLK. Counter 142 can then operate on the rising edge of the inverted version of the clock signal.

Each of the counters 141, 142 accumulates a count of rising edges (falling edges) during a period in which it is enabled and outputs a digital value equal to this count. Outputs of the counters 141, 142 are applied to an output stage. In this embodiment, the output stage comprises an adder 151. An output of the adder 151 can be selectively output to storage 150. Data can be selectively output from storage 150 to a data bus. As described above, the data output from storage 150 can be one of: an accumulated counter value which has been shifted (if required) based on the ramp signal used during conversion; an accumulated counter value (unshifted) and a ramp indicator.

Figure 13:
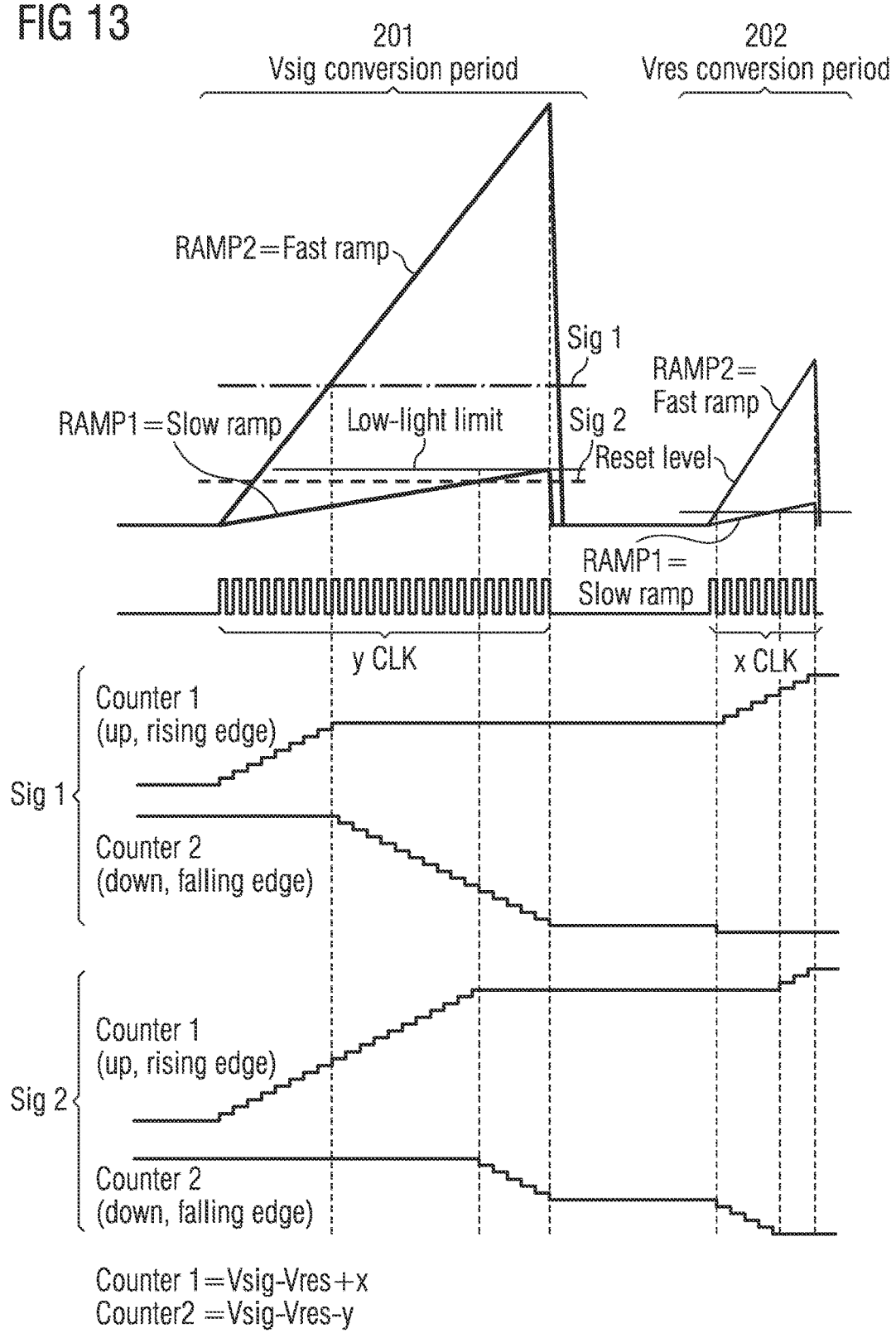
FIG. 13 shows operation of the ADC of FIG. 12.

FIG. 13 shows operation of the ADC of FIG. 12 for two signals: a high light signal Sig 1 and a low light signal Sig 2. In these examples the same ramp comparator is used to control the counter during conversion periods 201 and 202. For the high light signal Sig 1, the fast ramp comparator 125 is selected to control the counter during the Vsig conversion period 201 because Sig 1 is above the low-light limit. During the Vsig conversion period 201 counter 141 is enabled up to the point where the fast ramp signal RAMP 2 crosses the analog signal Sig 1. Then, counter 141 is disabled and counter 142 is enabled. At the end of the Vsig conversion period counter 142 is disabled. During the Vres conversion period 201, counter 142 is initially enabled up to the point where the fast ramp signal RAMP 2 crosses the analog reset signal. Then, counter 142 is disabled and counter 141 is enabled. At the end of the Vres conversion period counter 141 is disabled. Conversion of the low-light signal Sig 2 and reset signal is performed in a similar manner using the slow ramp comparator 124. The accumulated counter value of counter 141 is:

$$V\text{sig} - V\text{res} + x.$$

The accumulated counter value of counter 142 is:

$$V\text{sig} - V\text{res} - y.$$

where:
x is the number of clock cycles in the Vres period and
y is the number of clock cycles in the Vsig period.

The values x and y can be subtracted from the final result by starting the counter at an offset value. For example, by starting counter 141 at −x, the final counter value is Vsig−

Vres. If a handover point is internally generated using the counter, then an appropriate adjustment can be made to the handover point.

The use of two counters provides a substantially constant current consumption during the conversion cycle, regardless of the analog signal values, because one of the counters is always operating. If the counters use clock signals with offset phases, additional conversion accuracy is possible.

The number of counters can be increased beyond two. More generally, there can be a set of C counters divided into a sub-set of M counters and a sub-set of K counters, where C=M+K.

Figure 14:
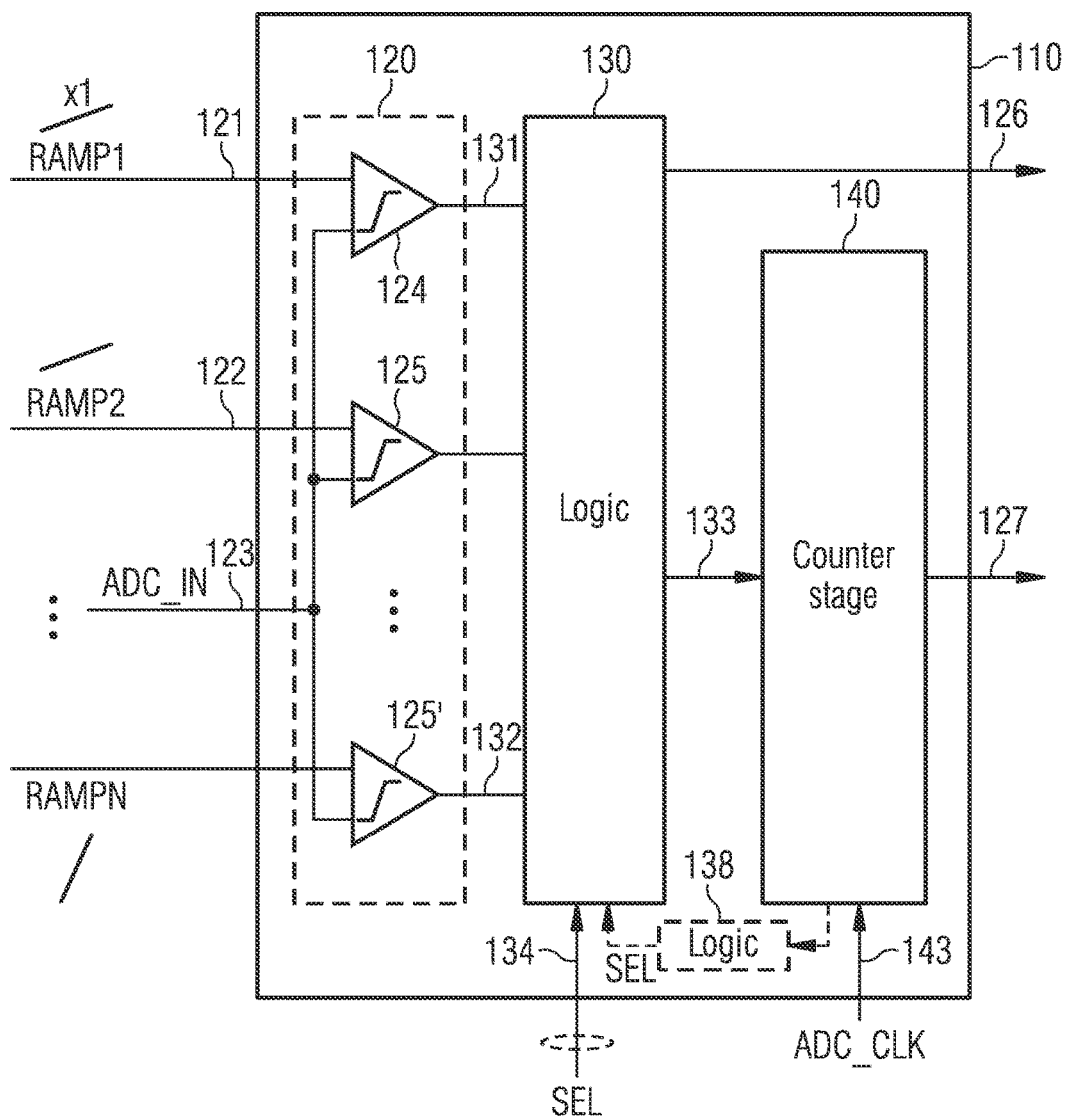
FIG. 14 shows an ADC unit with three ramp signal inputs.

The examples described above use two ramp signals RAMP1, RAMP2. It is possible to extend the number of ramp signals to N, where N is an integer ≥2. FIG. 14 shows an ADC with N ramp signals. The ADC has N comparators. Each comparator has an input connected to one of the ramp signals and an input connected to the analog input signal. Logic unit 130 is modified from the logic shown in FIG. 8. Multiple thresholds define the handover points between the different comparators. In general, N ramp signals and N−1 thresholds are required. Each threshold can be defined as a number of clock cycles from a start of a conversion period.

The number of handover points is N−1. The durations between the start of the conversion period and the N−1 handover points are predetermined. The durations between the start of the conversion period and the N−1 handover points consist of predetermined numbers of clock cycles.

A three ramp example can have ramp signals RAMP1, RAMP2, RAMP3 with the steepness ratios: RAMP2/RAMP1=2 and RAMP3/RAMP2=4. Possible threshold numbers of clock cycles (assuming a total number of clock cycles=256) are: SEL1=32 and SEL2=64.

Figure 15:
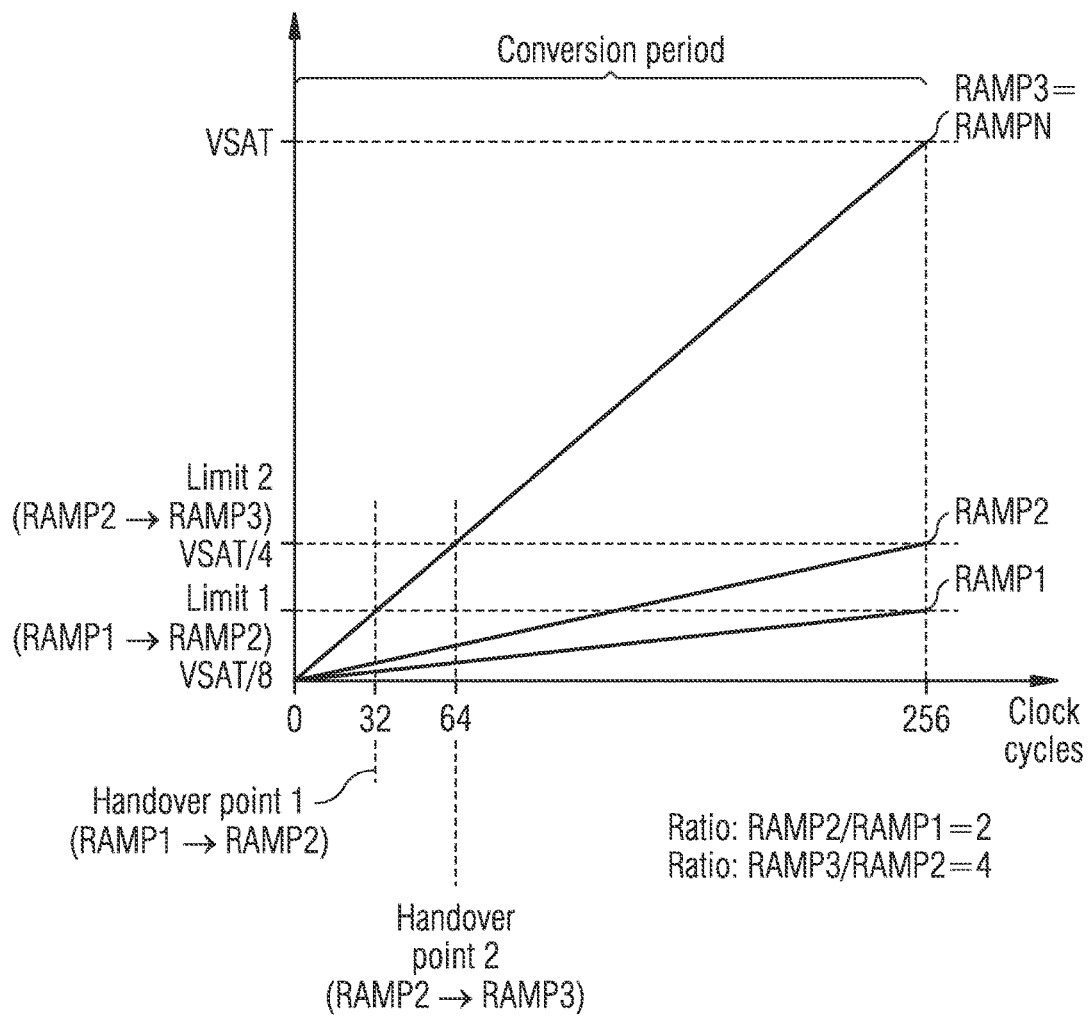
FIG. 15 shows operation of the ADC of FIG. 14.

FIG. 15 shows operation of a three ramp ADC (N=3). The three ramps—RAMP1, RAMP2, RAMP3—have the ratios defined above. The number of handover points is N−1. There are (N−1)=2 limits and two thresholds/handover points. Each limit and corresponding handover point can be considered as associated with comparison of one of the ramp signals with the analog signal ADC_IN. So, an $n^{th}$ limit and threshold/handover point is associated with an $n^{th}$ comparator. A comparison of the $N^{th}$ (fastest) ramp signal RAMP3 with the analog signal ADC_IN provides the earliest indication of which range the analog signal ADC_IN falls within. If the comparison output of the $N^{th}$ ramp signal RAMP3 has changed state before the handover point associated with the $n^{th}$ comparison output has been reached, the $n^{th}$ comparison output is used to control the counter stage. If the $N^{th}$ comparison output has not changed state before the handover point associated with the $n^{th}$ comparison output has been reached, the $(n+1)^{th}$ comparison output is used to control the counter stage. This is now explained using the example of FIG. 15.

Until the first handover point 1, only the first comparator 124 (the comparator connected to the first ramp signal RAMP1 which is the shallowest ramp signal) is connected to the counter. The second comparator 125 and a third comparator 125' are conditionally connected later.

At the first handover point 1 (n=1), the third comparator 125' (connected to the fastest ramp signal RAMPN) is checked. If the third comparator 125' has toggled before the first handover point 1, it indicates that the analog signal ADC_IN is in the range:

0<analog signal ADC_IN<Limit 1.

The first comparator 124 remains connected to the counter stage 140. If the third comparator 125' has not toggled before the first handover point 1, it indicates that the analog signal ADC_IN is in the range:

Limit 1<analog signal ADC_IN<VSAT.

The second comparator 125 is one of the two possible counters to control the counter stage 140. Thus, the second comparator 125 is connected to the counter stage 140.

At a second handover point 2 (n=2), the third comparator 125' (connected to the fastest ramp signal RAMPN) is checked again. If the third comparator 125' has toggled before the second handover point 2, it indicates that the analog signal ADC_IN is in the range:

Limit 1<analog signal ADC_IN<Limit 2.

The second comparator 125 is best-suited to control the counter stage 140. The second comparator 125 is connected to, or remains connected to, the counter stage 140. The first comparator 124 remains connected to the counter stage 140 although it will not have any effect, as it is known that the analog signal ADC_IN is above Limit 1. If the third comparator 125' has not toggled before the second handover point 2, it indicates that the analog signal ADC_IN is in the range:

Limit 2<analog signal ADC_IN<VSAT.

Therefore, the third comparator 125' is connected to the counter stage 140. The first and the second comparators 124, 125 remain connected to the counter stage 140 although they will not have any effect, as it is known that the analog signal ADC_IN is above Limit 2. Alternatively, the first and the second comparators 124, 125 may be turned off for reducing power consumption. For example, a comparator having an output signal that is not used may be disconnected from the power supply.

A four ramp example can have ramp signals RAMP1, RAMP2, RAMP3, RAMP4 with the steepness ratios: RAMP2/RAMP1=2, RAMP3/RAMP2=2, RAMP4/RAMP3=2. Suitable threshold numbers of clock cycles (assuming a total number of clock cycles=256) are: SEL1=32, SEL2=64 and SEL3=128. These ratios can be adapted to the application or desired performance.

The comparison stage 120 can have N comparators, or N comparison outputs. Each output provides a comparison of one of the N ramp signals with the analog signal ADC_IN. This has an advantage of providing a more constant loading of the ramp signals, as each distributed ramp signal is always connected to a constant number of comparators in the plurality of ADCs 110.

For the N>2 case (e.g. N=3, N=4 . . . ), it can be possible to provide a comparison stage 120 with a smaller number of comparison outputs. For example, the comparison stage 120 can have a smaller number of comparators. A minimum of two comparison outputs/comparators can be used. One of the comparators can be connected to the fastest ramp signal RAMPN. The other comparator can be selectively connected to one of the ramp signals, depending on which ramp signal should control the counter stage at that point during the conversion period. Ramp signals can be switched to dummy loads when they are not connected to a comparator to provide a more constant loading of the distributed ramp signals.

Each threshold can be signaled to the logic unit 130 by a respective signal SEL, similar to the signal SEL shown in FIG. 9, which toggles state when the threshold number of clock cycles is reached. Thus, the N−1 handover points are signaled by the signal SEL. It is also possible to input one multi-bit digital signal SEL which represents which threshold has been crossed, instead of a bundle of individual 1-bit SEL lines. If this option is used, additional logic is required to encode and decode the multi-bit SEL signal.

In any of the examples described above, at least one of the values used in the ramp ratio can be a non-integer value.

An advantage of at least one example is that it does not require an offset-compensated preselection comparator and buffered reference voltage. Instead, simple digital logic is used.

An advantage of at least one example is that it allows faster conversion as there is no requirement to perform an initial ramp selection process, before the main A-to-D conversion period. Instead, selection of the best ramp is performed during the main conversion period. The method of operation is free of a ramp selection process or a ramp selection phase.

An advantage of at least one example is that the multiple ramp signals are loaded in a balanced manner, which can improve linearity and reduce artefacts.

An advantage of at least one example is that the digital signal SEL can be changed after each conversion, such as in a random fashion. This can randomise the fixed pattern noise of the ADC at the switching point between ramp signals. If not randomised or calibrated, the fixed pattern noise of the ADC can be visible to the human eye even when its value is lower than that of the temporal noise.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of embodiments is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. An analog-to-digital converter for an imaging device comprising:
    an analog signal input for receiving an analog signal from a pixel array of the imaging device;
    N ramp signal inputs for receiving N ramp signals, where N is an integer ≥2, the N ramp signals having different slopes;
    a clock input for receiving at least one clock signal;
    a comparison stage connected to the ramp signal inputs and to the analog signal input, the comparison stage comprising a minimum of two comparators and being configured to compare the ramp signals with the analog signal during a conversion period and to provide comparison outputs;
    a counter stage; and
    a control stage which is configured to:
        control the counter stage based on the comparison outputs and a selection input indicative of when at least one handover point has been reached during the conversion period, wherein the handover point is indicative of a point at which a comparison output of a different one of the ramp signals with the analog signal is operable to control the counter stage,
        determine, during the conversion period, if a comparison output of the $N^{th}$ ramp signal has changed state before the handover point associated with a comparison output of an $n^{th}$ ramp signal has been reached, where n is an integer in the range 1 . . . N−1; and
        use the comparison output of the $n^{th}$ ramp signal to control the counter stage, if the comparison output of the $N^{th}$ ramp signal has changed state before the handover point associated with the comparison output of the $n^{th}$ ramp signal has been reached.

2. The analog-to-digital converter according to claim 1, wherein the control stage is configured to use the comparison output of a first ramp signal to control the counter stage after a start of the conversion period and before a first handover point.

3. The analog-to-digital converter according to claim 1, wherein the control stage is configured to use a comparison output of the $(n+1)^{th}$ ramp signal to control the counter stage, if the comparison output of the $N^{th}$ ramp signal has not changed state before the handover point associated with the comparison output of the $n^{th}$ ramp signal has been reached, wherein the $(n+1)^{th}$ ramp signal has a higher slope than the $n^{th}$ ramp signal.

4. The analog-to-digital converter according to claim 1, further comprising an output stage which is configured to output a counter value which has been scaled based on a comparison output of which ramp signal controlled the counter stage during the conversion period.

5. The analog-to-digital converter according to claim 1, further comprising an output stage which is configured to output a counter value and an indication of a comparison output of which ramp signal controlled the counter stage during the conversion period.

6. The analog-to-digital converter according to claim 1, wherein the converter is configured to determine when the handover point has been reached during the conversion period using an output of the counter stage.

7. The analog-to-digital converter according to claim 1, wherein the comparison stage comprises N comparators, each comparator having a first comparator input connected to one of the N ramp signal inputs, a second input connected to the analog signal input and a comparison output.

8. An image sensor comprising:
    a pixel array; and
    an analog-to-digital conversion apparatus comprising:
        a plurality of analog-to-digital converters;
        a ramp signal generator configured to generate N ramp signals, where N is an integer ≥2, the N ramp signals having different slopes; and
        a clock signal generator configured to generate at least one clock signal,
    wherein an analog-to-digital converter of the plurality of analog-to-digital converters comprises:
        an analog signal input for receiving an analog signal;
        N ramp signal inputs for receiving the N ramp signals;
        a clock input for receiving the at least one clock signal;
        a comparison stage connected to the ramp signal inputs and to the analog signal input, the comparison stage comprising a minimum of two comparators and being configured to compare the ramp signals with the analog signal during a conversion period and to provide comparison outputs;
        a counter stage; and a control stage which is configured to control the counter stage,
wherein the analog-to-digital converter is configured to:
convert a first analog signal during a first conversion period,
convert a second analog signal during a second conversion period, wherein one of the analog signals represents a signal level following exposure of a pixel of the pixel array and the other of the analog signals represents a reset level of the pixel of the pixel array,
select a comparison output of one of the ramp signals to control the counter stage during the first conversion period, and
select a comparison output of a different one of the ramp signals to control the counter stage during the second conversion period.

9. The image sensor according to claim 8, wherein the analog-to-digital converter is configured to:
select a comparison output of one of the ramp signals to control the counter stage during the first conversion period; and subsequently,
use the same comparison output to control the counter stage during the second conversion period.

10. The image sensor according to claim 8, wherein the analog-to-digital converter is configured to:
convert the first analog signal representing the signal level following exposure of the pixel during the first conversion period; and subsequently,
convert the second analog signal representing the reset level of the pixel during the second conversion period.

11. The image sensor converter according to claim 8, wherein an output stage is configured to output a digital value representative of a difference between the first analog signal and the second analog signal.

12. A method of analog-to-digital conversion for an imaging device comprising:
receiving an analog signal from a pixel array of the imaging device;
receiving N ramp signals, where N≥2, the N ramp signals having different slopes;
receiving at least one clock signal;
comparing the ramp signals with the analog signal during a conversion period to provide comparison outputs by a comparator stage comprising a minimum of two comparators;
controlling a counter stage to generate a digital signal by selecting one of the comparison outputs to control the counter stage based on the comparison outputs and a selection input indicative of when at least one handover point has been reached during the conversion period, wherein the handover point is indicative of a point at which a comparison output of a different one of the ramp signals with the analog signal is operable to control the counter stage;
determining, during the conversion period, if a comparison output of the $N^{th}$ ramp signal has changed state before the handover point associated with a comparison output of an $n^{th}$ ramp signal has been reached, where n is an integer in the range 1 . . . N−1; and
using the comparison output of the $n^{th}$ ramp signal to control the counter stage, if the comparison output of the $N^{th}$ ramp signal has changed state before the handover point associated with the comparison output of the $n^{th}$ ramp signal has been reached.

* * * * *